United States Patent
Mallinson (10) Patent No.: US 9,647,640 B2
(45) Date of Patent: May 9, 2017

(54) SEMI-ANALOG FIR FILTER WITH HIGH IMPEDANCE STATE

(71) Applicant: ESS Technology, Inc., Milpitas (CA)

(72) Inventor: A. Martin Mallinson, Kelowna (CA)

(73) Assignee: ESS Technology, Inc., Milpitas, CA (US)

( * ) Notice: Subject to any disclaimer, the term of this patent is extended or adjusted under 35 U.S.C. 154(b) by 178 days.

(21) Appl. No.: 14/790,448

(22) Filed: Jul. 2, 2015

(65) Prior Publication Data
US 2016/0006416 A1  Jan. 7, 2016

Related U.S. Application Data

(60) Provisional application No. 62/020,930, filed on Jul. 3, 2014.

(51) Int. Cl.
*G06F 17/10* (2006.01)
*H03H 15/02* (2006.01)

(52) U.S. Cl.
CPC .................................. *H03H 15/02* (2013.01)

(58) Field of Classification Search
None
See application file for complete search history.

(56) References Cited

U.S. PATENT DOCUMENTS

| | | | | |
|---|---|---|---|---|
| 5,544,081 A | * | 8/1996 | Yukawa | H03M 3/504 708/3 |
| 5,563,819 A | * | 10/1996 | Nelson | H03H 15/02 708/819 |
| 6,064,614 A | * | 5/2000 | Khoury | H03H 15/00 327/52 |
| 6,668,013 B1 | | 12/2003 | Okuno | |
| 7,028,070 B2 | * | 4/2006 | Mallinson | H03H 15/00 708/5 |
| 7,248,629 B2 | | 7/2007 | Hatamian | |
| 7,346,645 B2 | * | 3/2008 | Reynolds | H03H 15/02 708/819 |
| 7,352,826 B2 | * | 4/2008 | Krishnaswami | H03H 11/26 307/409 |
| 8,001,172 B2 | * | 8/2011 | Mallinson | G06G 7/1928 708/5 |
| 8,504,601 B2 | * | 8/2013 | Mallinson | H03H 17/06 708/208 |
| 9,323,959 B2 | * | 4/2016 | Mallinson | G06G 7/02 |

(Continued)

*Primary Examiner* — David H Malzahn
(74) *Attorney, Agent, or Firm* — Gard & Kaslow LLP (57) ABSTRACT

A system and method is disclosed for placing some of the elements of a FIR filter into a high impedance state in certain situations. When it is detected that the signal to an impedance element is the same as the previous value, then the driver of that impedance element is "turned off" or goes into a high impedance state, so that no current flows through that impedance element, and it no longer contributes to the filter output. Alternatively, if the impedance elements are the same between two adjacent taps of the delay line, the driver of one of those impedance elements may be turned off or go into a high impedance state. The technique may be particularly useful in differential output filters. Turning off a driver effectively removes the attached impedance element from the filter and reduces current flow and power consumption, thus extending battery life in mobile devices.

13 Claims, 6 Drawing Sheets

(56) References Cited

U.S. PATENT DOCUMENTS

| | | | |
|---|---|---|---|
| 9,490,774 B2 * | 11/2016 | Mallinson | H03H 15/00 |
| 2006/0123075 A1 * | 6/2006 | Mallinson | H03H 15/00 |
| | | | 708/422 |
| 2009/0135035 A1 | 5/2009 | Fifield | |
| 2009/0237283 A1 | 9/2009 | Tu et al. | |
| 2011/0135032 A1 | 6/2011 | Dally | |
| 2012/0246208 A1 | 9/2012 | Mallinson | |
| 2013/0254253 A1 * | 9/2013 | Mallinson | G06G 7/02 |
| | | | 708/819 |
| 2013/0285766 A1 * | 10/2013 | Mallinson | H03H 7/0138 |
| | | | 333/168 |
| 2016/0006416 A1 * | 1/2016 | Mallinson | H03H 15/02 |
| | | | 708/301 |

\* cited by examiner

SEMI-ANALOG FIR FILTER WITH HIGH IMPEDANCE STATE

This application claims priority to Provisional Application No. 62/020,930, filed Jul. 3, 2014, which is incorporated by reference herein in its entirety.

FIELD OF THE INVENTION

The present invention relates generally to electronic filters, and more particularly to finite impulse response (FIR) filters.

BACKGROUND OF THE INVENTION

A finite impulse response (FIR) filter is a type of electronic filter with a broad range of applications. FIR filters are widely used in both digital signal processing and digital video processing, and their construction is well known in the art.

Figure 1:
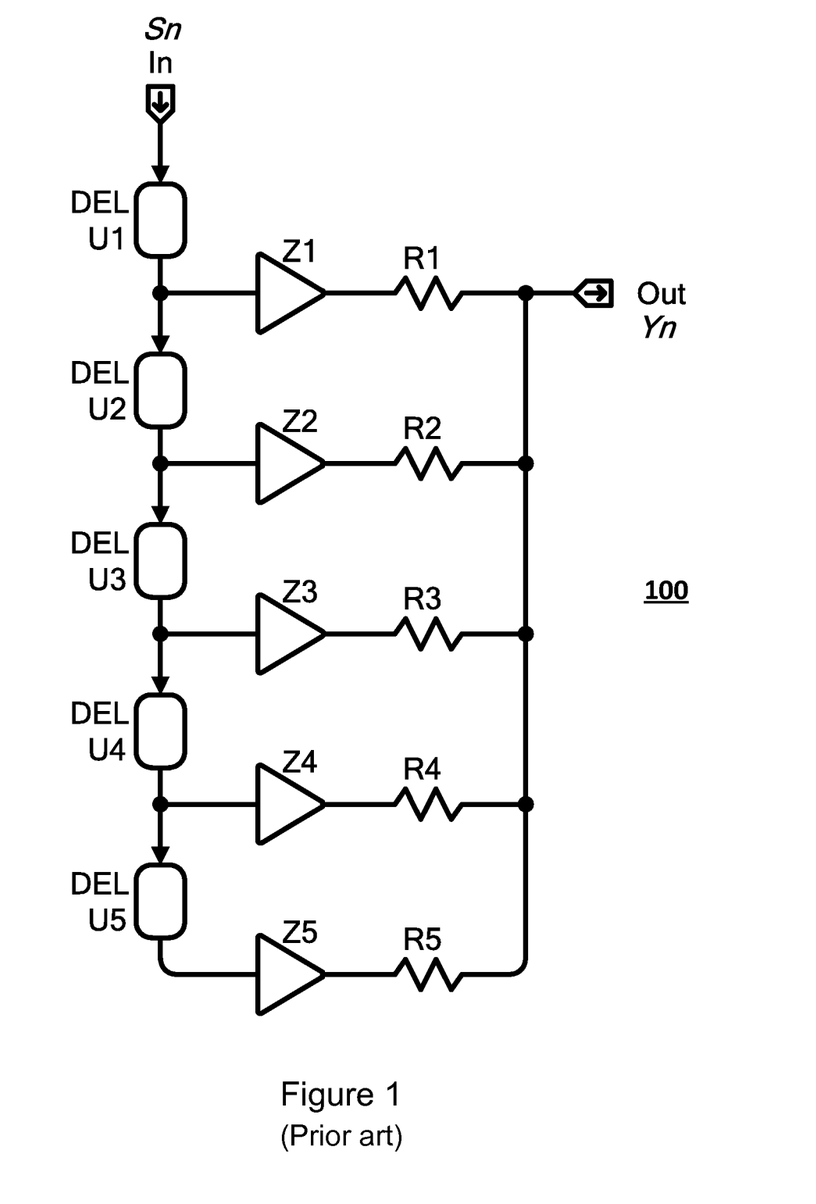
FIG. 1 is a block diagram of a typical prior art finite impulse response (FIR) filter.

One type of FIR filter known in the art is a transversal filter, or tapped delay line filter, as shown by circuit 100 in FIG. 1. The output of such a filter 100 is a weighted combination of voltages from impedance elements R1 to R5, which weight samples of an input signal taken from uniformly spaced taps on a delay line, and is thus a weighted sum of the current input value In and a finite number of previous values of the input. Because the outputs of the impedance elements are summed to get the overall output Out, the output is proportional to the sum of the delayed voltages divided by the resistances connected to the respective voltages. The proportionality of the output of the filter of FIG. 1 is thus a constant, the constant being the parallel impedance of all the resistances.

The filter contains a plurality (here 5 are shown) of unit delay elements U1 to U5, each of which introduces a delay of time t. Delay elements U1 to U5 are all clocked by the same clock, so that the input signal propagates at a desired sampling rate. The filter is considered to be of the Mth order, where M−1 is the number of delay elements, so the filter of FIG. 1 is a 6$^{th}$ order filter.

The output of each of the delay elements U1 to U5 is connected at a tap to an element having an impedance value, typically through some buffering means, such as buffers/drivers Z1 to Z5; here, the elements having impedance values are shown as resistors R1 to R5. One of skill in the art will recognize that while this example and the following discussion use resistors to indicate the impedance values for purposes of illustration, other types of circuit elements also have impedance values, for example, capacitors, inductors, or depletion mode MOSFETs, and any device having an impedance that does not otherwise interfere with operation of the filter may be used to provide the desired impedance values as described herein.

The resistors all share a common output point shown as Out on FIG. 1. As an input signal progresses through the delay elements, each resistor causes the signal on the respective delay element to which it is attached to contribute to the output signal in inverse proportion to the resistor value. Thus, if the resistor is small, the signal on the attached delay element will have a larger contribution to the output voltage, while if the resistor is large the contribution to the output will be smaller.

By properly selecting the resistor values in a set of resistors, a FIR filter is designed to provide an output with a desired frequency response. The resistor values are typically calculated by a software program which takes the desired frequency response as an input.

It is well known that the basis of a FIR filter is the mathematics of Fourier transforms. By properly selecting the resistor values in a set of resistors as the inverse of a set of Fourier coefficients that is calculated to provide a desired frequency response, a FIR filter is designed to provide an output with that response. The resistor values are typically calculated by a software program which takes the desired frequency response as an input.

The output of a FIR filter is thus generally characterized by the expression:

$$\text{Out} = \sum_{i=0}^{N} In_i * W_i$$

where N is the number of elements in the filter, the values of $W_i$ represent the set of weighting factors implemented by the resistors, and the values of $In_i$ represent a series of delayed versions of the input signal.

In a typical FIR filter, the delay between each value of $In_i$ may be, for example, 1 nanosecond (nS), and the filter may consist of, for example, 30 elements or more. However, this a broad generalization, and there are many variations of both the delay time and the number of elements that are known to those of skill in the art.

The values of $W_i$ and $In_i$ may be continuous, i.e., analog quantities, or may be quantized, i.e., digital or digitally encoded quantities. However, one limitation on an "all analog" FIR filter is the delay elements: although a transmission line is an easy way to implement such delay elements, such a line is impractical to implement on a silicon chip.

One way to avoid this limitation is to use a digital representation of the input signal, i.e., to use values of $In_i$ that are digital which may be easily delayed in a logic circuit; the precise analog signal is not important since all that is necessary to encode a digital signal is whether the signal is high or low relative to some threshold and thus results in a 1 or a 0. A FIR filter built in this way, where the values of the delayed input $In_i$ are digital and the values of the weighting factors $W_i$ are analog, is commonly referred to as a semi-analog FIR filter.

A semi-analog FIR filter is advantageous since it replaces the delay elements that would be needed to delay an analog signal in an analog transmission line with clocked digital delay elements. Such digital delay elements impose two degrees of quantization on the analog signal. First, since the delay elements are clocked, they can only change state on the clock edge, and events are therefore now quantized to the timing edges of the clock. Second, being digital elements, the values of amplitude of their outputs are now just 0 or 1, rather than the original analog qualities. This may be contrasted to an analog transmission line: a delay line constructed from an analog transmission line can pass any signal amplitude and can make a transition between continuous levels at any time.

A semi-analog FIR filter thus has the benefit of a clocked digital delay line, and is thus practical to build on a silicon chip. The delay elements may, for example, be clocked D-flip-flops (DFFs) where the delay time is defined by a common clock, or simply logic gates in which the delay time is the logic gate transition time (known as the "gate delay"). It may be seen that if the input signal to the circuit 100 of FIG. 1 is a digital signal, and the delay elements U1 to U5 are clocked digital delay elements, the circuit is a semi-analog FIR filter, as the output is still the sum of the products from the resistors and thus an essentially continuous analog output.

Using such a semi-analog FIR filter allows any signal that may be conveniently represented in a digital form to be processed by the filter. For example, a square wave signal at 100 megahertz (MHz) may be fed into a delay line consisting of logic gates and the output of the gates summed with the appropriate weighting to make an analog output, and, with the appropriate weightings of $W_i$, may even generate an analog sine wave from the digital square wave.

In conventional semi-analog FIR filters, current flows continuously through the resistors R1 to R5, and thus power is continuously consumed while the filter is operating. Since such filters are commonly used in signal processing in portable devices, such as smart phones, tablets, and laptop computers, which run on batteries of limited capacity, the power consumption of such filters is part of the total power consumption of the device and contributes to limiting the time the device may be operated before the batteries are drained.

SUMMARY OF THE INVENTION

A method and system is disclosed for placing some of the elements of a FIR filter into a high impedance state in certain situations.

One embodiment discloses a finite impulse response filter comprising: an input configured to receive an input signal; a delay line comprising a plurality of delay elements in series and connected to the input for propagating and delaying the input signal; a plurality of buffers, each buffer in the plurality of buffers coupled to the delay line after a separate one of the plurality of delay elements so as to receive the delayed input signal after the input signal has passed through the connected delay element; a plurality of control elements, each control element in the plurality of control elements coupled to a separate one of the plurality of buffers and configured to detect the delayed input signal immediately before and after the delay element to which the buffer is coupled and cause the buffer connected to the control element to not pass the delayed input signal through the buffer if the delayed input signal immediately before the delay element to which the buffer is coupled is the same as the delayed input signal after the same delay element; a plurality of impedance elements having impedance values, each of the plurality of impedance elements coupled to a different one of the plurality of buffers than each other impedance element in the plurality of impedance elements so as to receive a delayed input signal when the connected buffer passes the delayed input signal and provide an output weighted by the impedance value of the impedance element, the impedance values of the plurality of impedance elements selected such that the sum of the outputs of the plurality of impedance elements produces a selected frequency response to the input signal; and an output coupled to the plurality of impedance elements to produce an output signal.

Another embodiment discloses a finite impulse response filter having a differential output for providing a first output signal and a second output signal which is the complement of the first output signal, comprising: an input configured to receive an input signal; a delay line comprising a plurality of delay elements in series and connected to the input for propagating and delaying the input signal; a plurality of buffers, each buffer in the plurality of buffers coupled to the delay line after a separate one of the plurality of delay elements so as to receive the delayed input signal after the input signal has passed through the coupled delay element, configured to either provide the delayed input signal and an inverted delayed input signal as outputs or to be placed in a state in which there is no output, in response to a control signal; first and second pluralities of impedance elements having impedance values, the impedance values of the first set of impedance elements being the same as the impedance values of the second set of impedance elements, the impedance values of the each plurality of impedance elements selected such that the sum of the outputs of each plurality of impedance elements produces a signal of a selected frequency response to the input signal, each of the first plurality of impedance elements and each of the second plurality of impedance elements coupled to a different one of the plurality of buffers than each other impedance element in the first and second pluralities of impedance elements to receive the delayed input signal, two impedance elements having the same impedance values being coupled to each buffer, the one from the first plurality of impedance elements receiving the delayed input signal from the buffer and the one from the second plurality of impedance elements receiving the inverted delayed input signal, an output connected to the first plurality of impedance elements to produce a first output signal; and an output connected to the second plurality of impedance elements to produce a second output signal which is the complement of the first output signal.

Still another embodiment discloses a method of designing a finite impulse response filter having a delay line containing a plurality of delay elements and providing a differential output, comprising: receiving at a processor a selected frequency response for the filter; calculating by the processor an impedance value for each of a first plurality of impedance elements, each impedance element from the first plurality of impedance elements to be coupled to the delay line after a different delay element than each other impedance element in the first plurality of impedance elements so as to receive a delayed input signal and provide an output weighted by the impedance value of the impedance element, the impedance values of the first plurality of impedance elements calculated such that a sum of the outputs of the first plurality of impedance elements is a first output signal of the selected frequency response; determining by the processor whether the first plurality of impedance elements contains two adjacent impedance elements having the same impedance values, and, if so, preventing the second such impedance element from the first plurality of impedance elements from contributing to the first output signal such that the remaining impedance elements in the first plurality of impedance elements create an adjusted first plurality of impedance elements; connecting by the processor the outputs of the adjusted first plurality of impedance elements to provide an output signal; determining by the processor a second plurality of impedance elements having the same impedance values as the adjusted first plurality of impedance elements to be coupled to the delay line with the same impedance values after the same delay elements but receiving an inverted delayed input signal; and connecting by the processor the outputs of the second plurality of impedance elements to provide a signal which is the complement of the output signal.

DETAILED DESCRIPTION OF THE INVENTION

Described herein is a system and method for effectively placing some of the impedance elements of a FIR filter into a high impedance state in certain situations. When an impedance element is in a high impedance state, no current flows through it and it thus consumes no power. Placing some of the impedance elements in a high impedance state thus reduces the power consumption of a FIR filter.

As above, the impedance elements represent the coefficients of a transfer function. In certain cases some of the coefficients of a selected transfer function may be omitted and the resulting, now altered, transfer function treated in a way so as to compensate for the omitted coefficients. One way coefficients may be omitted is by effectively "turning off" the corresponding impedance elements from the filter by placing the drivers of those impedance elements into a high impedance state, so that no current flows through the impedance elements and they do not contribute to the output of the filter.

This may advantageously be done in at least two situations. First, when it is detected that the value of a delayed sample of a signal to an impedance element is the same as the value of the immediately preceding sample to that impedance element, i.e., the sample from one sampling interval earlier, then rather than driving the signal through that impedance element and creating a voltage that is included in the filter output, the driver of that impedance element is "turned off" or goes into a high impedance state, so that no current flows through that impedance element, it no longer contributes to the filter output, and it consumes no power while it is "off."

In another situation, if the coefficients of a transfer function are such that there are two identical coefficients adjacent to one another, the values of two consecutive impedance elements located at two adjacent taps of the delay line will be the same. The driver of one of those impedance elements may be turned off or go into a high impedance state, again effectively turning off that impedance element so that it does not contribute to the output of the filter and reducing current flow and power consumption.

Referring back to FIG. 1, again it will be seen that current always flows through the resistors, and power is thus always consumed, when the filter 100 is in operation. If some of the resistors can be "turned off," or placed into a condition of high impedance so that current is not always flowing through them, then the power consumption of the filter may be reduced. The issue thus becomes whether this can be done without losing any of the information contained in the input signal.

One of skill in the art will appreciate that in a digital signal which is a sequence of 1's and 0's, a string of the same value, i.e., all 1's or all 0's, will simply result in a continuous value for the output. Thus, the relevant "information" contained in a signal is present in, and may be ascertained from, the changes in value of the signal from a 1 to a 0 and vice versa, as well as in the actual values of the signal. This means that the information contained in the signal may be retrieved by processing the changes in the signal, rather than having to process the entire signal itself.

Accordingly, in one embodiment, in order to process the signal, the changes in the value of the delayed input signal are evaluated as the input signal is passed down the delay line. When the value of the input signal to be passed to an impedance element is found to be the same as the immediately previous value of the input signal, that impedance element is "turned off" by causing the driver of the impedance element to go to a high impedance state so that no signal is propagated from that impedance element to the output.

Figure 2:
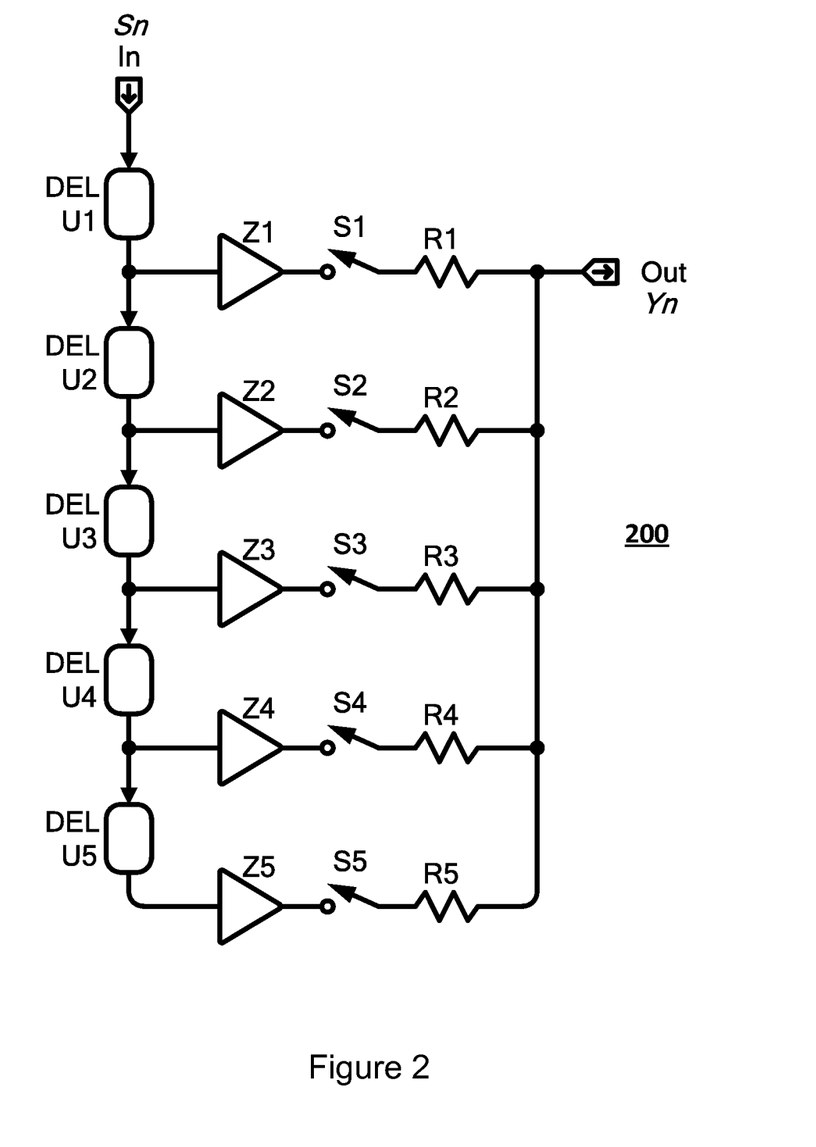
FIG. 2 is a block diagram of a FIR filter according to one embodiment.

FIG. 2 illustrates this concept. Filter 200 is similar to filter 100 in FIG. 1, again having delay elements U1 to U5, drivers Z1 to Z5, and resistors R1 to R5. Now, however, circuit 200 also contains switches S1 to S5 which connect the taps between the delay elements to the drivers Z1 and Z5 and the corresponding resistors R1 to R5, and which allow the resistors to be selectively disconnected from the delay line. When it is determined that the delayed input signal to a particular driver has not changed, or the impedance values are the same at two adjacent drivers between delay elements, the switch to one of those impedance elements may be opened so that the impedance element is disconnected from the delay line and no longer draws current, thus reducing the power consumed by the filter.

It will be apparent that it is also necessary to have a way of determining whether the value of the delayed input signal has changed value or is the same at two adjacent drivers. This may be done, for example, by a control element such as a controller (e.g., a processor, not shown) which monitors the signal at each driver and either compares the current delayed input signal value at the driver to the immediately preceding signal value, or compares the values at two adjacent drivers, to see if they are the same.

Figure 3:
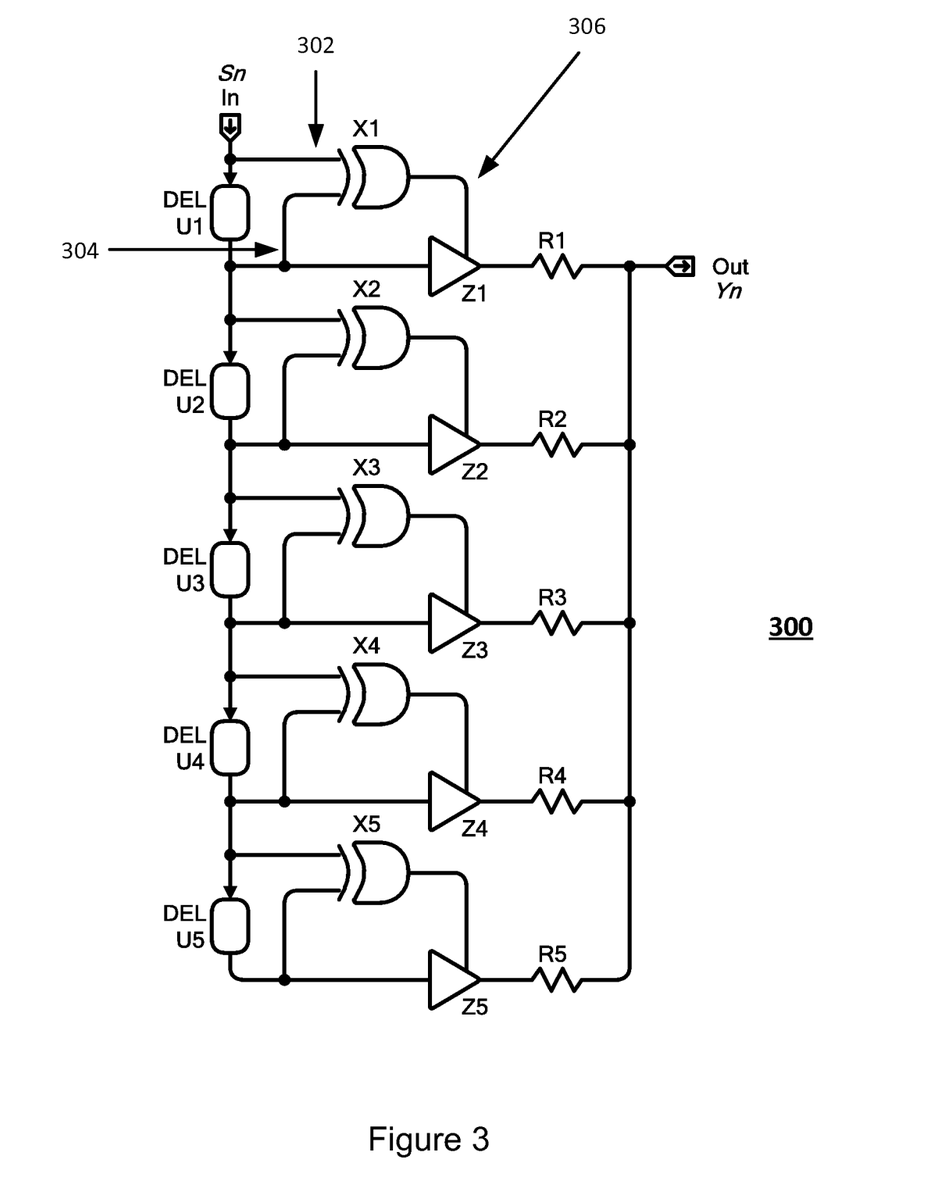
FIG. 3 is a block diagram of a FIR filter according to another embodiment.

An alternative solution that does not use a controller is shown in FIG. 3. Circuit 300 again has delay elements U1 to U5, drivers Z1 to Z5, and resistors R1 to R5. Instead of switches S1 to S5 as in circuit 200 in FIG. 2, in circuit 300 there are exclusive-or (XOR) gates X1 to X5. Each XOR gate has one input connected to one side of one of the delay elements U1 to U5, and the other input connected to the other side of the same delay element as illustrated.

For example, as shown, XOR gate X1 receives two inputs 302 and 304; input 302 is the signal on the delay line before delay element U1, and input 304 is the signal on the delay line after delay element U1. Thus, XOR gate X1 receives samples of the input signal which are taken at two separate times, one before delay element U1, and one after delay element U1, so that the two times at which the samples were taken is separated by the delay period of the delay elements. The output of XOR gate X1 is a value which is input as a signal 306 to driver Z1. The other XOR gates X2 to X5 are similarly connected to the other delay elements U2 to U5 and drivers Z2 to Z5.

As will be known to one of skill in the art, an XOR gate will output a high signal, a value of 1, only when the two inputs differ, i.e., when the signal on one side of the delay element is different than the signal on the other side of the delay elements, which means that the signal has changed between one sample and the next. If the two inputs are the same, whether they are both high or both low, an XOR gate will output low signal, a value of 0. This signal will be used to control the drivers as explained below.

While the drivers Z1 to Z5 in circuits 100 and 200 need only to pass the signal from the delay line, whether high or low, in circuit 300 the drivers Z1 to Z5 are now tri-state buffers which, in addition to having a high and low state corresponding to the signal value, have a third state of high impedance, in which no signal is passed through the driver at all. In addition to receiving the signal values from the delay line, tri-state buffers Z1 to Z5 each have an additional input which causes the driver to go to that high impedance state.

In the embodiment of FIG. 3, as above these additional inputs are the outputs of the XOR gates X1 to X5, and a driver Z1 to Z5 is put into a high impedance state if the additional input is a low value, i.e., a value of 0. A driver is only "on" and able to pass a signal from the delay line when the additional input to the driver from the connected XOR gate is a high signal, i.e., a value of 1. If the driver receives a low signal, it is not on, and goes to the high impedance state and does not pass a signal.

When the signal has changed from one sample to the next, one side of a delay element, its input, will have a different value than the other side of that delay element, its output. The XOR gate attached to that delay element will thus receive two inputs that are not the same, and will output a high value, turning the driver on and allowing it to pass the signal from the delay line tap. This in turn allows current to flow through the attached resistor and be part of the filter output.

Conversely, when the signal has not changed from one sample to the next, one side of a delay element will have the same value as the other side of that delay element. The XOR gate attached to that delay element will instead receive two inputs that are the same, and will now output a low value. Since the driver now receives a low value, it is not turned on and does not pass the signal from the delay line tap.

In a similar fashion to the circuit 100 of FIG. 1, the outputs of the resistors of circuit 300 that still receive signals from the delay line are summed together to produce a filtered signal. The output of circuit 300 will be a different signal than that of circuit 100, even if the resistors values are the same in both circuits, since which outputs from the various resistors are included in the output signal will change as the input signal varies.

For this reason, placing some of the coefficient values into the high impedance state as the input signal varies will also change the transfer function of the FIR filter as which outputs from resistors are included in the output signal of the filter. One of skill in the art will appreciate that changing the resistor outputs included in the output signal will also change the effective impedance of the filter, which would otherwise be the effective impedance of all of the impedance elements in parallel if all of the impedance elements were active.

Thus, if the currents from the impedance elements (i.e., those that have not been effectively turned off by placing their drivers in a high impedance state) are simply added together, the resulting output will not appear to be the signal that would be expected from the filter if all of the impedance elements are connected, but rather may seem to be a sequence of random voltages appearing at intervals of the sampling period.

To correct for this, instead of simply taking the sum of the currents from the impedance elements as the output signal, that sum is bandwidth limited, for example by passing the sum of the currents through a capacitor (not shown).

One of skill in the art will appreciate that there is a time constant to the circuit comprised of the output impedance and the capacitor, in this case an RC circuit, which is based upon the effective impedance of the filter and the capacitance of the capacitor attached to the output. That time constant will of course change when the effective impedance of the filter changes. If the time constant is larger than the sample period, then the seemingly random variations in the output signal at intervals of the sampling period will be filtered out of the output signal and the average value of the output will be taken, causing a non-random output signal to appear.

In fact, the changes in the time constant will compensate for the changes in the transfer function. Tests confirm that the changes in the impedance from placing coefficients in a high impedance state and back, and the resulting changes in the time constant, cancel out the changes in the transfer function with one exception. The bandwidth-limited output of the filter of circuit 300 of FIG. 3 is not the output from the transfer function of the entire filter as in circuit 100 of FIG. 1. Rather, the output of circuit 300, which has changing combinations of impedance elements, becomes the derivative of the output function of the circuit 100, which has all of the impedance elements in their low impedance states passing all samples of the input signal.

One of skill in the art will recognize that having a signal which is the derivative of a selected transfer function is still extremely useful, as the derivative of, for example, a sine wave is another sine wave. Since Fourier analysis shows that any signal can be considered as some combination of sine waves, the derivative of a signal is likewise a combination of sine waves. One of skill in the art will further appreciate how to use the derivative of a signal to accomplish the same things as the signal from which the derivative is taken.

In another embodiment, a high impedance state may be applied to coefficient drivers that are driving coefficient values that are the same as the adjacent coefficient values. For example, in circuit 200 in FIG. 2, if resistor R2 is of the same value as resistor R1, and resistor R4 is of the same value as resistor R3, switches S2 and S4 may be opened, thus effectively placing resistors R2 and R4 in a high impedance state, so that they do no contribute to the output Out.

In fact, even if multiple sequential resistors are of the same value, all but the first may be disconnected from the output. If, for example, resistors R2, R3 and R4 are all of the same value as resistor R1, all three switches S2 to S4 may be opened so that all three resistors R2 to R4 are excluded from the output Out. Since there is no resistor value before R1 to be compared, R1 remains connected to the output Out.

Again, the new value of Out will be the derivative of the original output with all resistors connected, and again the bandwidth of Out should be limited to smooth out the variations in the output that occur at the delay intervals.

Another way of using this alternative embodiment is in semi-analog FIR filters having differential outputs, such as those shown in, for example, U.S. Pat. No. 8,504,601, commonly owned by the assignee of the present application. Such circuits may benefit from a high impedance state applied to coefficient drivers that are driving coefficient values that are the same as the adjacent coefficient values.

Figure 4:
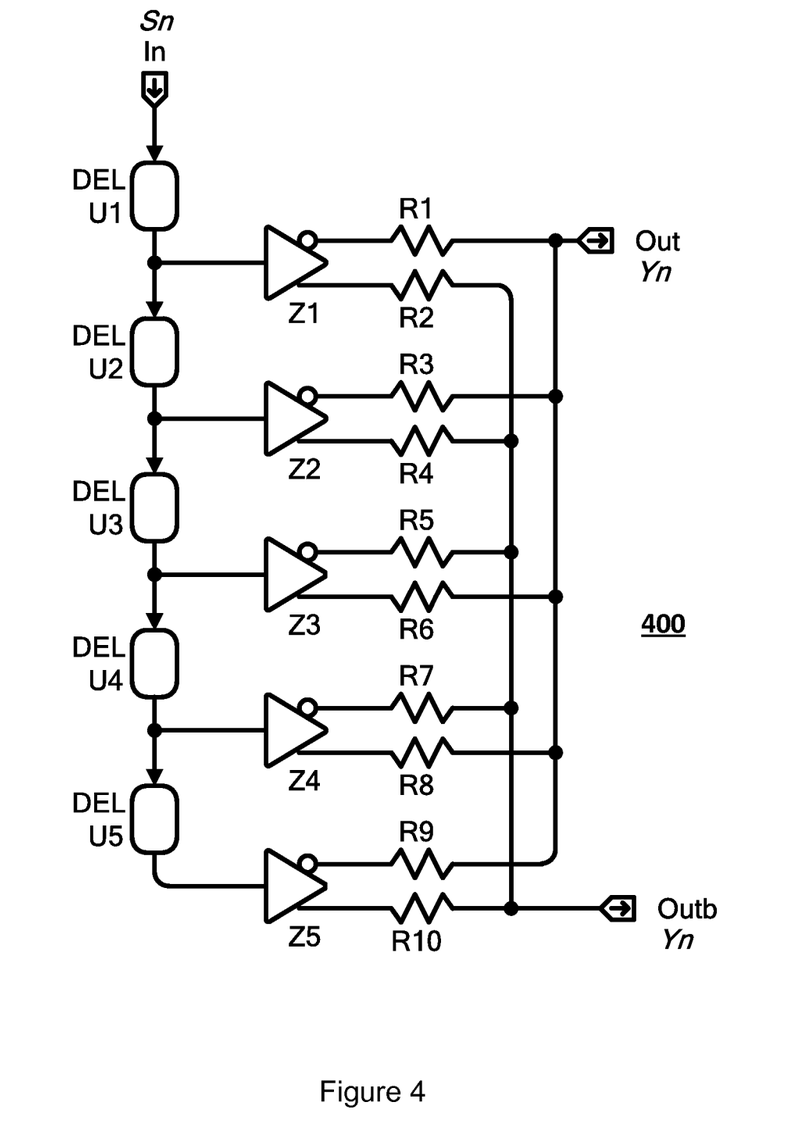
FIG. 4 is a block diagram of a differential output FIR filter according to one embodiment.

FIG. 4 shows a circuit 400 which is a differential output FIR filter. In circuit 400, assuming that all of the resistor values are the same, it may be seen that resistors R1 and R2 are connected to the outputs Out and Outb respectively in the same way as resistors R3 and R4 and resistors R9 and R10. On the other hand, resistors R5, R6, R7 and R8 are connected to the output in the opposite fashion to resistors R1 and R2. Drivers Z1 to Z5 provide both delayed input signals and inverted delayed input signals as outputs, the inverted outputs being indicated by the bubbles on drivers Z1 to Z5 in FIG. 4.

If the connection of resistors R1 and R2 is characterized as representing a signal of 1, then the five coefficients in order will appear to be 1, 1, −1, −1, 1. Because driver Z2 and resistors R3 and R4 is making the same coefficient as driver Z1 and resistors R1 and R2, driver Z2 may be turned off, i.e., placed in a condition of high impedance, so that the coefficient made by resistors R3 and R4 is not present in the output.

Similarly, since driver Z4 and resistors R7 and R8 make the same coefficient as driver Z3 and resistors R5 and R6, driver Z4 may also be placed in a high impedance state so that the coefficient made by resistors R7 and R8 is not present in the output.

Figure 5:
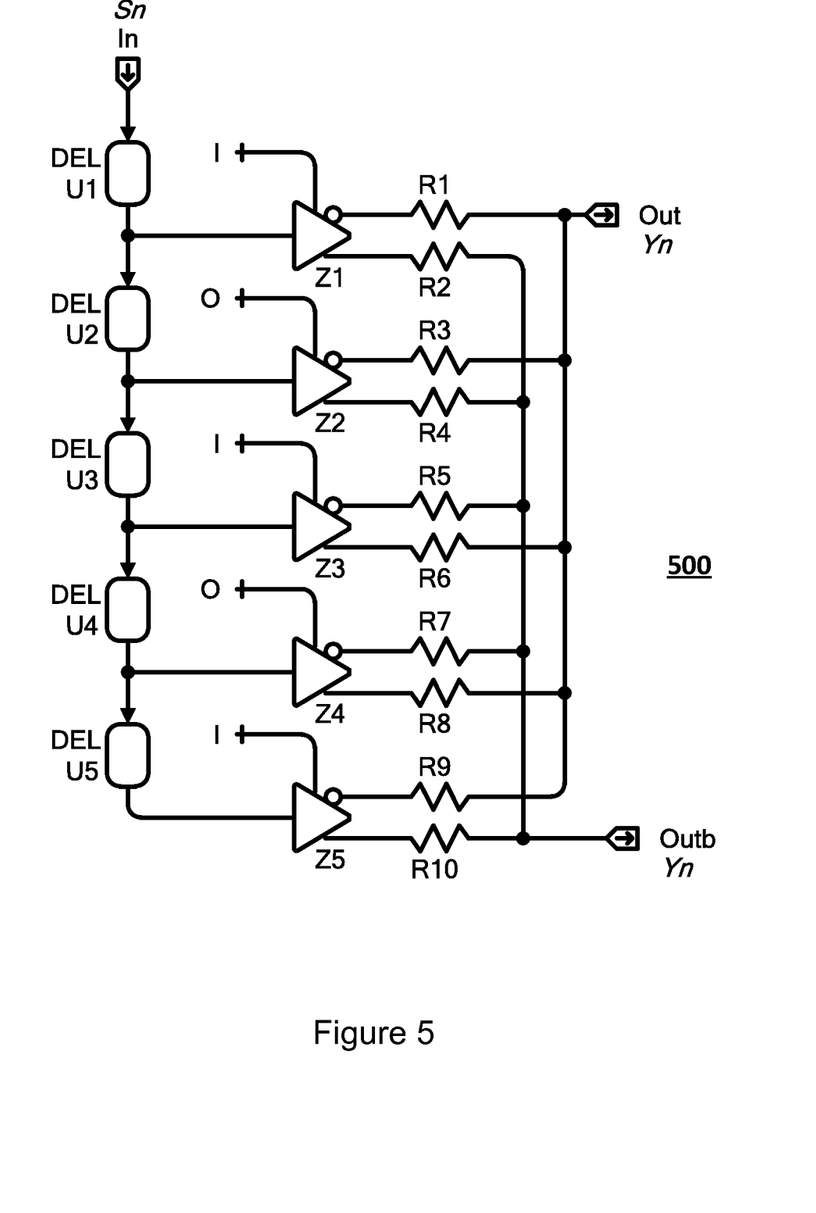
FIG. 5 is a block diagram of a differential output FIR filter according to another embodiment.

An alternative version of circuit 400 is circuit 500 of FIG. 5. In circuit 500, drivers Z1 to Z5 are again tri-state buffers, and again provide both inverted and non-inverted outputs. Drivers Z1, Z3 and Z5 receive inputs (the non-signal input) of 1, which turns them on so that tapped signal values are passed to resistors R1, R2, R5, R6, R8 and R10. Conversely, drivers Z2 and Z4 receive non-signal inputs of 0 so that they are in high impedance states and do not pass tapped signal values to resistors R3, R4, R7 and R8.

Similarly to the situation discussed above with respect to FIG. 2, if more than two pairs of resistors having the same values are connected to the outputs in the same way, all but the first pair may be disconnected from the output. The first pair remains connected to the output since there is no previous pair of resistors to be compared to the first pair.

Again, if impedance elements are disconnected from the outputs Out and Outb, the "new" outputs will be the derivatives of what they would have been if all of the impedance elements were connected.

In the case of differential output filters such as those shown in FIGS. 4 and 5, in some embodiments the coefficients may be known when the filter is designed. In such cases, the decision to disable drivers where the coefficients are identical to adjacent drivers may be made at the time of the design. Alternatively, a decision may be made to not even manufacture those resistors (or other impedance elements) of identical value if their drivers are to be permanently disabled.

In other embodiments, it may be possible to program the coefficients, and thus adjust the impedance values, while the filter is in operation; in such a case the decision to turn the drivers on or off may be made during operation by a controller in the device as above, or by the use of XOR gates as above.

Figure 6:
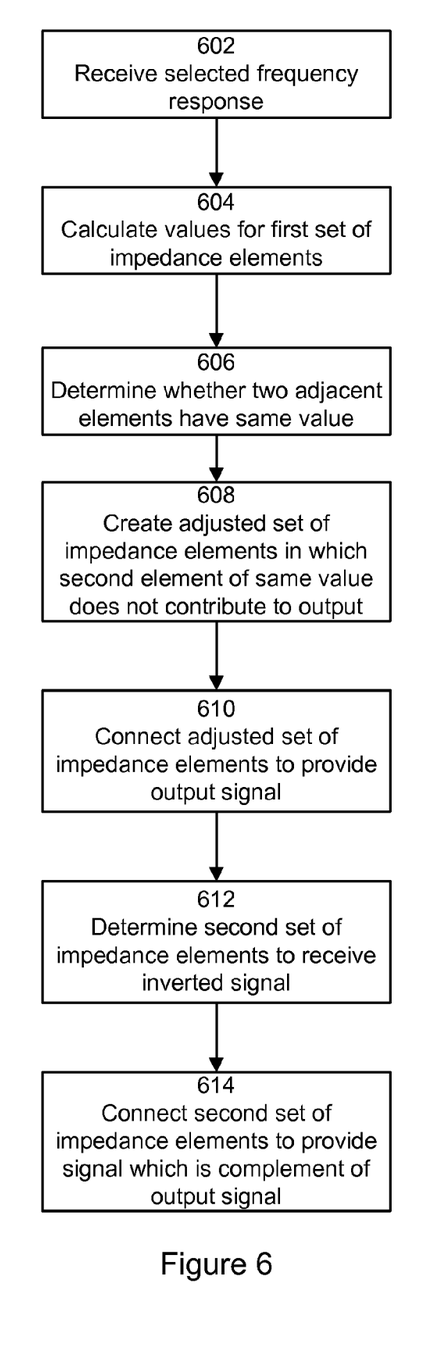
FIG. 6 is a flow chart of a method for designing a differential output FIR filter using a processor according to one embodiment.

FIG. 6 is a flowchart of a method by which a processor may design a filter such as that shown in FIG. 5. At step 602, the processor receives as an input a selected frequency response for a semi-analog FIR filter having differential outputs. The selected frequency response may be input by a user, i.e., a designer of a circuit or device in which such a filter is to be used, or in some cases the input may be received from another processor or program.

At step 604, the processor calculates impedance values for a first set of impedance elements which, when coupled to a delay line, will result in a transfer function for the filter which provides the desired frequency response. This is typically done by calculating a set of Fourier coefficients for the transfer function, and then selecting impedance values which are the inverse of those coefficients. One of skill in the art will be aware of commercially available software programs that accept a desired frequency response as input and provide a set of coefficients as output. One such program is MATLAB© from MathWorks™.

At step 606, the processor next determines whether any pair of two adjacent impedance elements have the same value. At step 608, the processor prevents the second of the two such impedance elements from contributing to the output of the filter, for example, by including in the design a signal that sets the buffer delivering a delayed input signal to that impedance element to a high impedance state as discussed above and determines an adjusted set of impedance elements containing those impedance elements that will contribute to the output and excluding those that will not contribute. Alternatively, the impedance elements to be prevented from contributing to the output of the filter may simply be removed from the design completely.

At step 610 the processor connects the outputs of the impedance elements in the adjusted set of impedance elements to provide an output signal.

At step 612, the processor determines a second set of impedance elements having the same values as the adjusted set of impedance elements and coupled to the delay line as the corresponding elements in the adjusted set of impedance elements, but each receiving an inverted delayed signal rather than the (non-inverted) delayed input signal received by the adjusted set of impedance elements. As above, such inverted signals may be provided by, for example, buffers between the delay line and the impedance elements.

At step 614, the processor connects the outputs of the second set of impedance elements to provide a signal which is the complement of the output signal as described above.

As above, in some embodiments it may be desirable to bandwidth limit the output signal and the complement of the output signal by connecting a bandwidth limiting element, such as a capacitor, to the summed outputs of the impedance elements.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

For example, it is expected that the described method and apparatus may be used with other FIR filter configurations than the single FIR filter or differential output FIR filter configurations described herein. Further, while the described embodiments concern digital signals comprised of only values of 1 and 0, the described method and apparatus should be applicable to any quantized signal, i.e., any signal having a number of quantized levels rather than being a analog signal having a continuously varying level.

In addition to smart phones and other mobile devices such as tablets or laptops, it is expected that the described method and apparatus will also be useful in any other device in which a FIR filter is powered by a battery and the battery life is a concern.

As above in some embodiments a controller may be used to detect when adjacent samples or coefficient values are the same, and to disconnect impedance elements from the delay line, for example by the use of switches. Various types of controllers or processors may be used, and various types of switches in addition to the described embodiment using XOR gates.

It should also be appreciated that the described method and apparatus can be implemented in numerous ways, including as a process, an apparatus, or a system. The methods described herein may be implemented by program instructions for instructing a processor to perform such methods, and such instructions recorded on a computer readable storage medium such as a hard disk drive, floppy disk, optical disc such as a compact disc (CD) or digital versatile disc (DVD), flash memory, etc. It may be possible to incorporate the described methods into hard-wired logic if desired. It should be noted that the order of the steps of the methods described herein may be altered and still be within the scope of the disclosure.

These and other variations upon the embodiments are intended to be covered by the present disclosure, which is limited only by the appended claims.

What is claimed is:

1. A finite impulse response filter comprising:
   an input configured to receive an input signal;
   a delay line comprising a plurality of delay elements in series and connected to the input for propagating and delaying the input signal;
   a plurality of buffers, each buffer in the plurality of buffers coupled to the delay line after a separate one of the plurality of delay elements so as to receive the delayed input signal after the input signal has passed through the connected delay element;
   a plurality of control elements, each control element in the plurality of control elements coupled to a separate one of the plurality of buffers and configured to detect the delayed input signal immediately before and after the delay element to which the buffer is coupled and cause the buffer connected to the control element to not pass the delayed input signal through the buffer if the delayed input signal immediately before the delay element to which the buffer is coupled is the same as the delayed input signal after the same delay element;
   a plurality of impedance elements having impedance values, each of the plurality of impedance elements coupled to a different one of the plurality of buffers than each other impedance element in the plurality of impedance elements so as to receive a delayed input signal when the connected buffer passes the delayed input signal and provide an output weighted by the impedance value of the impedance element, the impedance values of the plurality of impedance elements selected such that the sum of the outputs of the plurality of impedance elements produces a selected frequency response to the input signal; and
   an output coupled to the plurality of impedance elements to produce an output signal.

2. The finite impulse response filter of claim 1 wherein the control elements coupled to the buffers and configured to cause the connected buffers to not pass the delayed input signal through the buffer comprise switches connected between the delay line and the buffers, each of the switches having a closed position which passes the signal from the delay line to the connected buffer and an open position which does not pass the signal from the delay line to the connected buffer and caused to open so that no signal is passed from the delay line to the buffer when the delayed input signal immediately before the delay element to which the buffer is coupled is the same as the delayed input signal after the same delay element.

3. The finite impulse response filter of claim 2 further comprising a controller for detecting the delayed input signal immediately before and after each delay element and causing the switch connected to a buffer to open so as to not pass the delayed input signal to the buffer if the delayed input signal immediately before a delay element is the same as the delayed input signal after the same delay element.

4. The finite impulse response filter of claim 1 wherein:
   each of the buffers is configured to be placed in a high impedance state based upon a control signal such that the buffer does not pass a signal from the delay line to the connected impedance element; and
   the control elements are exclusive-or gates, each exclusive-or gate having one input connected to the delay line immediately before a separate one of the delay elements and another input connected to the delay line immediately after the same separate one of the delay elements, and an output connected to a separate one of the buffers, the output of each exclusive-or gate being the control signal for the buffer connected to that exclusive-or gate which causes the buffer to be placed in a high impedance state when the delayed input signal immediately before the delay element to which the buffer is coupled is the same as the delayed input signal after the same delay element.

5. The finite impulse response filter of claim 1 further comprising a device connected to the output for limiting the bandwidth of the output signal.

6. The finite impulse response filter of claim 1 wherein the device connected to the output is a capacitor.

7. The finite impulse response filter of claim 1 wherein the impedance elements are resistors.

8. The finite impulse response filter of claim 1 wherein the impedance elements are capacitors.

9. The finite impulse response filter of claim 1 wherein the impedance elements are inductors.

10. A finite impulse response filter having a differential output for providing a first output signal and a second output signal which is the complement of the first output signal, comprising:
    an input configured to receive an input signal;
    a delay line comprising a plurality of delay elements in series and connected to the input for propagating and delaying the input signal;
    a plurality of buffers, each buffer in the plurality of buffers coupled to the delay line after a separate one of the plurality of delay elements so as to receive the delayed input signal after the input signal has passed through the coupled delay element, configured to either provide the delayed input signal and an inverted delayed input signal as outputs or to be placed in a state in which there is no output, in response to a control signal;
    first and second pluralities of impedance elements having impedance values, the impedance values of the first set of impedance elements being the same as the impedance values of the second set of impedance elements, the impedance values of the each plurality of impedance elements selected such that the sum of the outputs of each plurality of impedance elements produces a signal of a selected frequency response to the input signal,
       each of the first plurality of impedance elements and each of the second plurality of impedance elements coupled to a different one of the plurality of buffers than each other impedance element in the first and second pluralities of impedance elements to receive the delayed input signal,
    two impedance elements having the same impedance values being coupled to each buffer, the one from the first plurality of impedance elements receiving the delayed input signal from the buffer and the one from the second plurality of impedance elements receiving the inverted delayed input signal, an output connected to the first plurality of impedance elements to produce a first output signal; and an output connected to the second plurality of impedance elements to produce a second output signal which is the complement of the first output signal.

11. The finite impulse response filter of claim 10 further comprising a control element for detecting whether the impedance elements coupled to a first buffer have the same impedance values as the impedance elements connected to a second immediately successive buffer, and placing the second buffer in a state in which it does not provide the delayed input signal and inverted delayed input signal as outputs if the two buffers are coupled to impedance elements having the same impedance values.

12. The finite impulse response filter of claim 10 further comprising a control element configured to determine that the impedance elements coupled to a first buffer have the same impedance values as the impedance elements connected to the immediately successive buffer and causing the second buffer to not provide the delayed input signal and inverted delayed input signal as outputs.

13. A method of designing a finite impulse response filter having a delay line containing a plurality of delay elements and providing a differential output, comprising:

receiving at a processor a selected frequency response for the filter;

calculating by the processor an impedance value for each of a first plurality of impedance elements, each impedance element from the first plurality of impedance elements to be coupled to the delay line after a different delay element than each other impedance element in the first plurality of impedance elements so as to receive a delayed input signal and provide an output weighted by the impedance value of the impedance element, the impedance values of the first plurality of impedance elements calculated such that a sum of the outputs of the first plurality of impedance elements is a first output signal of the selected frequency response;

determining by the processor whether the first plurality of impedance elements contains two adjacent impedance elements having the same impedance values, and, if so, preventing the second such impedance element from the first plurality of impedance elements from contributing to the first output signal such that the remaining impedance elements in the first plurality of impedance elements create an adjusted first plurality of impedance elements;

connecting by the processor the outputs of the adjusted first plurality of impedance elements to provide an output signal;

determining by the processor a second plurality of impedance elements having the same impedance values as the adjusted first plurality of impedance elements to be coupled to the delay line with the same impedance values after the same delay elements but receiving an inverted delayed input signal; and connecting by the processor the outputs of the second plurality of impedance elements to provide a signal which is the complement of the output signal.

* * * * *